United States Patent [19]

Pickering

[11] Patent Number: 4,518,932

[45] Date of Patent: May 21, 1985

[54] COAXIAL MAGNETRON HAVING CAVITY WALLS VIBRATED BY TUNING FORK

[75] Inventor: Alan H. Pickering, Springfield, United Kingdom

[73] Assignee: English Electric Valve Company, Ltd., Chelmsford, England

[21] Appl. No.: 407,274

[22] Filed: Aug. 10, 1982

[30] Foreign Application Priority Data

Sep. 8, 1981 [GB] United Kingdom ................ 8127125

[51] Int. Cl.[3] ........................ H03B 9/10; H01J 25/55

[52] U.S. Cl. .................................... 331/90; 331/178; 315/39.55; 315/39.61

[58] Field of Search .................... 331/86, 87, 90, 178; 315/39.51, 39.55, 39.59, 39.61

[56] References Cited

U.S. PATENT DOCUMENTS 3,087,124 4/1963 McLeod .............................. 332/16

3,440,565 4/1969 Scullin et al. .................... 315/39.55

3,727,099 4/1973 Burwell et al. ............. 315/39.61 X 3,731,137 5/1973 Foreman ..................... 315/39.61 X 4,311,968 1/1982 Pickering et al. ..................... 331/90

*Primary Examiner*—Eugene R. Laroche

*Assistant Examiner*—Robert J. Pascal

*Attorney, Agent, or Firm*—Spencer & Frank

[57] ABSTRACT

A co-axial magnetron is provided with a cavity whose resonant frequency can be very rapidly altered in a cyclic manner so that the microwave output frequency of the magnetron can be chosen to lie within the available frequency band of the cavity. The cylindrical walls of the co-axial resonant cavity are constituted by or coupled to the inner surfaces of one or more tuning forks which are maintained in vibration by externally mounted electro-magnetic transducers. As the tines of the tuning forks vibrate, the effect is to cyclically increase and decrease the effective diameter of the cavity, thereby changing its resonant frequency. An adjustable end plate can be provided for the cavity so that fine tuning or slow rate tuning can be provided in addition to the frequency agility provided by the tuning fork.

21 Claims, 6 Drawing Figures

COAXIAL MAGNETRON HAVING CAVITY WALLS VIBRATED BY TUNING FORK

BACKGROUND OF THE INVENTION

This invention relates to magnetrons. A magnetron produces a microwave output signal whose frequency is primarily dependent on the frequency characteristics of a resonant chamber associated with the magnetron. By altering the electrical properties of the chamber, the frequency of oscillation of the magnetron can be adjusted and this is often necessary to provide fine tuning of its output frequency. It is sometimes desirable to sweep the frequency of resonance periodically over a predetermined frequency range, but it is difficult to obtain fast sweep rates since the mechanical actuators and linkages usually necessary to produce an alteration of the electrical properties of the resonator exhibit a relatively great mechanical inertia.

It has been proposed to overcome these difficulties by using a tuning fork to vibrate one, or possibly both, of the end plates of the resonator chamber, and such an arrangement is described in our earlier UK patent application 7939909, now U.S. Pat. No. 4,311,968. The present invention seeks to provide an improved magnetron which is capable of superior operating performance.

SUMMARY OF THE INVENTION

According to this invention, a co-axial magnetron includes an annular resonant cavity which surrounds a cathode and which determines the frequency of oscillation of a microwave signal generated by the magnetron; tuning fork means operative to induce vibratory motion in the outer cylindrical walls of said annular resonator cavity so as to cyclically alter its resonant frequency; and means responsive to the movement of the outer cylindrical walls for generating a signal representative of the instantaneous resonant frequency of the cavity.

The tuning fork means can itself constitute the whole or part of the outer cylindrical walls of the annular resonant cavity, or instead the tines of the tuning fork means can be coupled to thin flexible material of general cylindrical form which constitutes the outer walls of the cavity. In either case, the mean cross-sectional shape of the cavity may not be exactly circular and the departure of the shape from a true circle which occurs as the walls are vibrated can be minimized by the use of more than one tuning fork means arranged around the outer walls of the cavity. In order to determine the instantaneous resonant frequency of the cavity, the movement of the walls or the movement of the tines of the tuning fork can be monitored, whichever is the more convenient.

BRIEF DESCRIPTION OF THE DRAWINGS

The invention is further described by way of example with reference to the accompanying drawings, in which.

DESCRIPTION OF THE PREFERRED EMBODIMENTS

Figure 1:
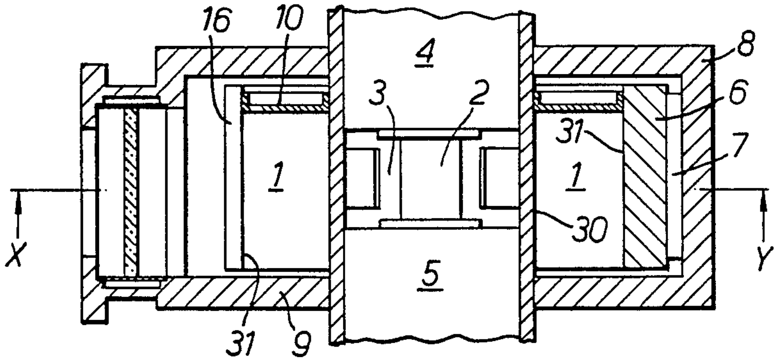
FIG. 1 shows a section view of a co-axial magnetron in accordance with the present invention.
Figure 2:
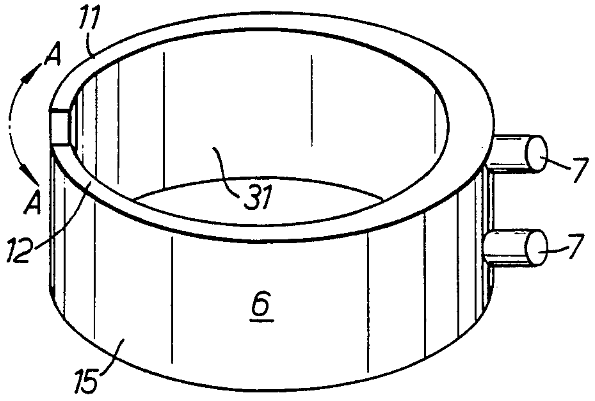
FIG. 2 shows a perspective view of a tuning fork which forms part of the co-axial cavity of the magnetron.
Figure 3:
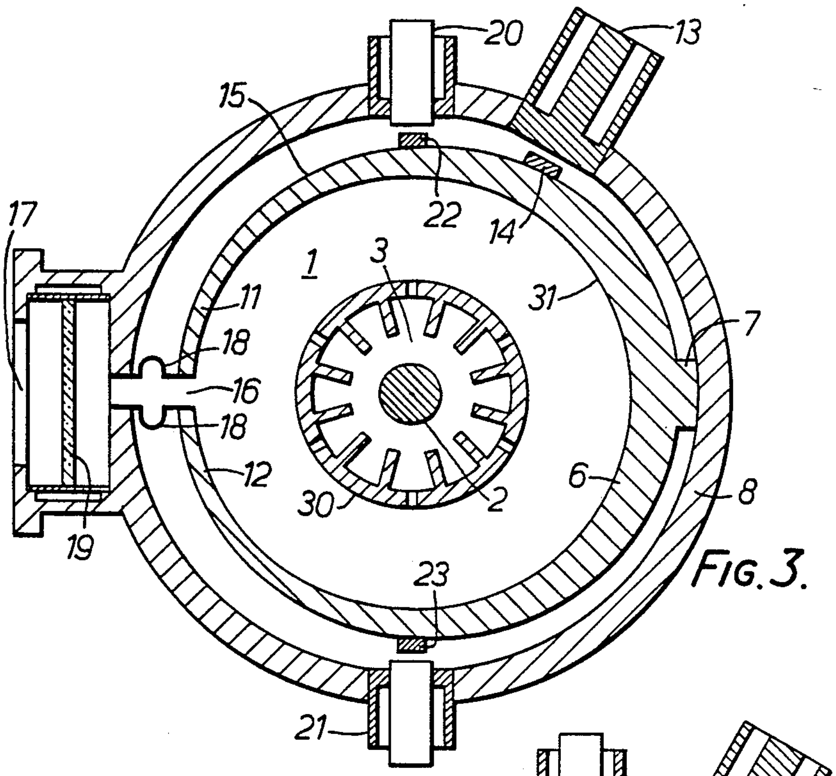
FIG. 3 is a plan section view of the same magnetron taken on line XY of FIG. 1, and FIGS. 4, 5 and 6 show alternative modifications to FIG. 3.

Referring to FIGS. 1, 2 and 3, a co-axial magnetron consists of an annular cavity 1 which surrounds an elongate cathode 2 and an interaction space 3 consisting of a large number of individual cavities which are spaced apart by anode vanes positioned around the cathode 2. These cavities constitute the anode structure, and a magnetic field is produced within the interactipon space 3 by means of magnets 4 and 5. The annular cavity 1 is formed by a pair of general cylindrical walls, the inner surface 30 of which is constituted by the anode structure and the outer surface 31 of which is constituted by one face of a tuning fork 6, which is firmly mounted at its base 7 to a rigid outer housing 8 which constitutes an evacuated envelope. The base 9 of the housing 8 constitutes one end plate of the cavity 1, and the opposite end plate of the cavity is constituted by a movable annaular ring 10.

The base 9, the ring 10 and the tuning fork 6 are made of a robust material which is suited to the mechanical functions which they have to provide, whilst the faces of these bodies which constitute the cavity 1 itself are copper plated to ensure good electrical conductivity.

In operation, electrons are emitted by the cathode 2 into the interaction space 3 when a large potential, usually in pulse form, is applied between the cathode and the anode structure. The electrons set up microwave oscillations under the influence of the magnetic field and under the influence of the very high electric field which exists between the anode walls of the interaction space 3 and the cathode 2. The resonant frequency is determined by the electrical properties of the interaction space 3 and by the resonant frequency of the annular cavity 1. The resonant frequency of the annular cavity 1 is determined by the physical dimensions of the walls 9, 10, 30 and 31 which bound it, and thus by moving the end plate 10 or by moving the cylindrical wall 31 of the tuning fork 6, the resonant frequency can be altered.

The outer cavity wall 31 is constituted by the tuning fork 6 which is mounted, as previously described, to the housing 8 at its base 7. The tuning fork 6 consists of two tines 11 and 12 which are set into vibration in anti-phase by means of a drive unit 13, which consists of an electro-magnet which acts upon an iron or magnetic body 14 mounted on the tine 11. The drive unit 13 is arranged to operate at the resonant frequency of the tuning fork 6 so as to impart the energy to it which is necessary for it to maintain oscillation. The mode of vibration is as represented by the arrows A shown in FIG. 2, and the effect is to cyclically increase and decrease the outer diameter of the co-axial cavity 1—in practice the outer surface 31 is likely to depart slightly from that of a true cylinder during the course of the cyclic movement. The actual frequency of vibration of the tuning fork is determined almost wholly by the mechanical properties and dimensions of the tuning fork itself. One of the most important properties of a tuning fork is that it is very sharply resonant at a predetermined frequency, and that it is unable to maintain vibration of frequencies which depart significantly from the resonant value. The tuning fork 6 is made in the form of two eccentric cylindrical surfaces, the inner surface 31 constituting the outer cylindrical wall of the co-axial cavity 1, and the outer cylindrical surface 15 of the tuning fork 6 having an axis which is displaced from that of the inner cylindrical surface 31 so as to give the increased thickness required at the base 7, and to allow the tines 11 and 12 to have a suitable mechanical taper towards their ends.

As the tuning fork 6 is vibrated so the resonant frequency of the cavity changes accordingly in a cyclic manner as previously described. When a pulse of electrical energy is applied to the magnetron, an output microwave signal is generated having a frequency which is determined by the instantaneous position of the tines 11 and 12. The microwave signal is coupled via the gap 16 between the adjacent open ends of the tines 11 and 12 to an output port 17. To maintain the electrical properties of the output port, a thin flexible connection of electrically conductive material 18 is provided to connect the respective end edges of the tines 11 and 12 to the output port 17 itself. An electrically transmissive window 19 is arranged within the output port 17 to allow the microwave energy to pass through without significant attenuation, but to preserve the vacuum within the body of the magnetron. The interior of the housing 8 is maintained at a very high level of vacuum, since only under this condition is the magnetron an efficient generator of microwave energy.

In order that the instantaneous resonant frequency of the cavity 1 can be accurately monitored each tine 11 and 12 is provided with an electro-magnetic transducer 20, 21, respectively, which are both mounted in the wall of the housing 8. A small piece of iron or magnet 22, 23 carried by each tine 11, 12 alters the coupling with the electro-magnetic transducers 20, 21 from which an output signal can be taken which is representative of the velocity of the tine at any instant. From a knowledge of the resonant properties of the tuning fork 6, the instantaneous frequency of the cavity can thus be determined.

The use of the tuning fork thus enables the magnetron to be operated in a frequency agile mode, that is to say, successive pulses of microwave energy can be generated at different predetermined frequencies which lie within the band represented by the maximum and minimum sizes of the resonant cavity 1 defined by the extent of the vibratory movement of the tines 11 and 12. In addition, the frequency of oscillation can be precisely adjusted or slightly varied, as required, by adjusting the position of the movable upper end cap 10, (by means not shown, but which can be of a conventional nature).

When the tuning fork 6 is in its normal mode of operation in which its two tines are in anit-phase, the mechanical losses and coupling to the outer shell 8 are very small. The power required by the drive unit 13 is very small and the oscillation is insensitive to vibrations of the magnetron. Any translational movement of the tuning fork 6 caused by the application or shock or large amplitude vibration to the magnetron as a whole causes a similar (i.e. in-phase) displacement of both tines, so that overall the resonant frequency is not adversely affected to any significant extent. Since the magnetron frequency is substantially independent of any in-phase tuning fork movement, the transducers 20 and 21 can take a particularly simple form since only a knowledge of the tine velocity is required as opposed to a knowledge of the absolute position of the tines 11 and 12.

Figure 4:
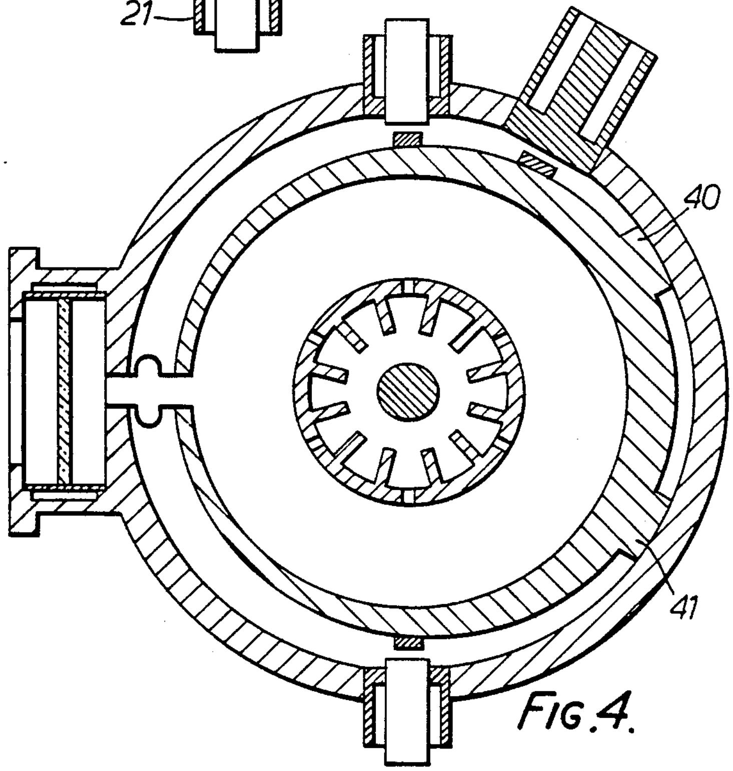

The tuning fork 6 can be mounted at a single fixing point 7, as is shown in FIG. 3, or it can be mounted through two nodes 40 and 41—this modification is as shown in FIG. 4. Alternatively, the tuning fork 6 can be firmly clamped at a node position to the face plate 9, although this variant is not illustrated.

Figure 5:
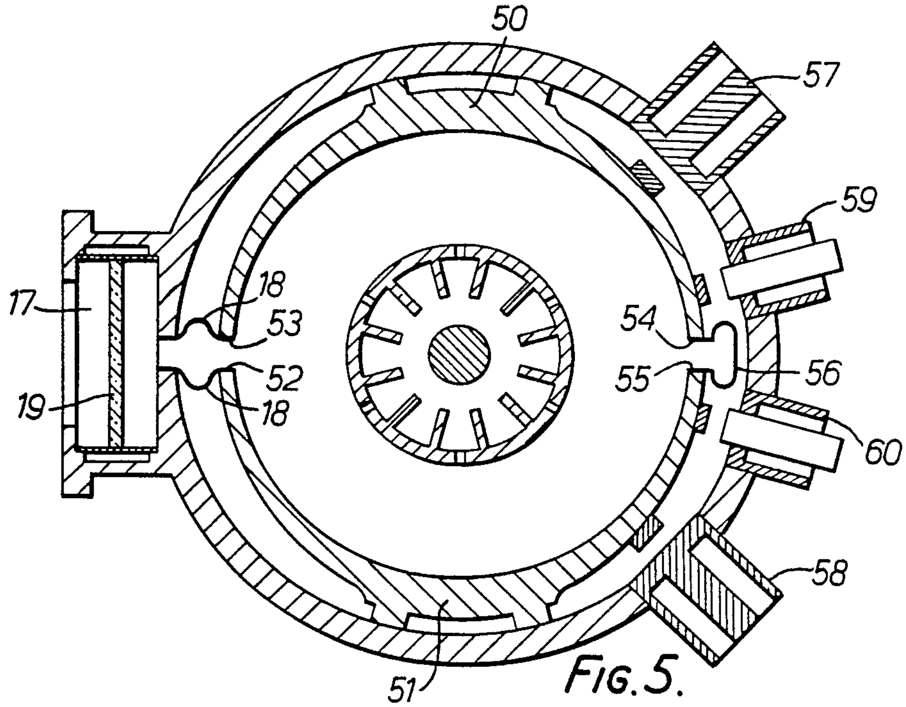

A further modification is shown in FIG. 5 in which two tuning forks 50 and 51 are provided which together constitute the outer cylindrical wall of the co-axial cavity. In this case, the ends of the tines 52, 53 adjacent to the output port 17 are connected thereto by flexible connections 18 as previously, but the other two tines 54 and 55 are electrically coupled by means of a flexible bridge 56 of conductive material. These flexible portions serve both to conduct the microwave currents circulating around the cavity, and to mechanically couple the tuning forks. Both tuning forks are carefully matched so that they exhibit exactly the same resonant frequency, and the provision of the bridge 56 constrains the two tuning forks 50, 51 to vibrate in step with each other. The use of two tuning forks 50, 51 enables the dimensions of the co-axial cavity 1 to approximate more closely to a circular cross-section, in that the symmetry of the cavity profile is maintained over the frequency tuning range to a greater extent. Each tuning fork 50 and 51 is provided with its own drive unit 57 and 58, and with its own transducer 59 and 60 from which the instantaneous frequency of resonance can be determined.

Figure 6:
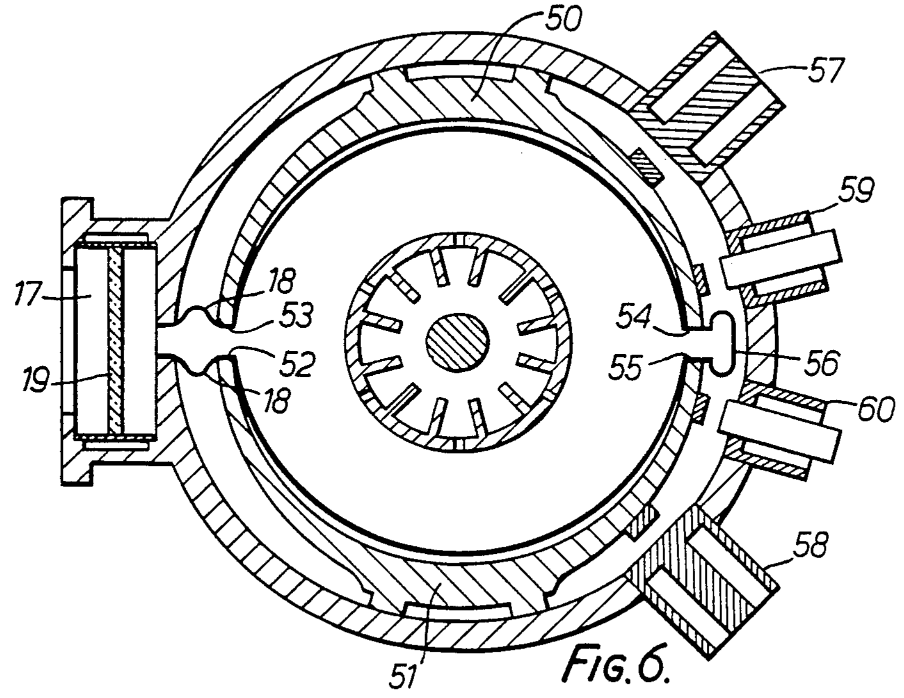

The symmetry of the shape of the co-axial cavity can be further enhanced by the provision of a greater number of tuning forks positioned regularly around the outer walls of the cavity. Instead of allowing the inner surface of the tines to themselves constitute the cavity walls, a thin band of thin metal such as copper which has a very good electrical conductivity could be mounted inside the tuning forks so that the ends of the band are connected only to the tips of the tuning fork, but do not otherwise contact it. Such an arrangement is shown in FIG. 6 and the shapes of the tines of the tuning forks are modified slightly from that shown in FIG. 5 so that the flexible band adopts an almost perfectly symmetrical circular profile. As the ends of the tines vibrate, the diameter of the cylinder constituted by the band will increase and decrease accordingly, but its profile will remain substantially the same, thereby minimizing the distortion which is present in the output microwave signal generated by the magnetron.

I claim:

1. A co-axial magnetron including an annular resonant cavity which is delimited by an outer cylindrical wall within the magnetron, which surrounds a cathode and which determines the frequency of oscillation of a microwave signal generated by the magnetron; tuning fork means operative to induce vibratory motion in the outer cylindrical wall of said annular resonant cavity so as to cyclically alter its resonant frequency; and means responsive to the movement of the outer cylindrical wall for generating a signal representative of the instantaneous resonant frequency of the cavity.

2. A magnetron as claimed in claim 1 and wherein the tuning fork means is provided with tines having inner surfaces of a generally cylindrical form, which at least partially surrounds the resonant cavity.

3. A magnetron as claimed in claim 2 and wherein the tuning fork means comprises a single tuning fork, having a pair of tines adapted to vibrate in anti-phase, the tines being arranged so as to almost wholly surround the resonant cavity, and the free ends of the tines being spaced apart from each other by an amount which defines an aperture through which microwave energy generated within the magnetron can be coupled to an output port.

4. A magnetron as claimed in claim 2 and wherein the tuning fork means comprises a plurality of tuning forks each of which has a pair of tines adapted to vibrate mutually in anti-phase, adjacent pairs of tines of different tuning forks being linked together at their free ends by a thin electrically conductive coupling which causes all tines to vibrate in step except for one pair of tines which have their free ends spaced apart from each other by an amount which defines an aperture through which microwave energy generated within the magnetron can be coupled to an output port.

5. A magnetron as claimed in claim 2, 3 or 4 and wherein the inner faces of the tines themselves constitute the outer cylindrical wall of the resonant cavity.

6. A magnetron as claimed in claim 3 or 4 and wherein a thin flexible band of conductive material is attached to the ends of the tines so as to be vibrated thereby, the inner surface of the band constituting the outer cylindrical wall of the annular cavity, and the band being arranged so as to permit coupling of the microwave energy through said aperture.

7. A magnetron as claimed in claim 1, 2, 3, or 4, further comprising an evacuated housing of the magnetron, and wherein said means responsive to the movement of the outer cylindrical wall comprises transducer means mounted in relation to the evacuated housing of the magnetron so as to monitor the movement of at least one tine of a tuning fork relative to it 8. A magnetron as claimed in claim 7 and wherein said transducer means comprises a separate velocity transducer provided to monitor the velocity of each tine relative to said housing.

9. A magnetron as claimed in claim 2, 3, or 4, further comprising an evacuated housing of the magnetron, wherein the inner faces of the tines themselves constitute the outer cylindrical wall of the resonant cavity, and wherein said means responsive to the movement of the outer cylindrical wall comprises transducer means mounted in relation to the evacuated housing of the magnetron so as to monitor the movement of at least one tine of a tuning fork relative to it.

10. A magnetron as claimed in claim 9 and wherein said transducer means comprises a separate velocity transducer provided to monitor the velocity of each tine relative to said housing.

11. A magnetron as claimed in claim 3 or 4, further comprising an evacuated housing of the magnetron, and a thin flexible band of conductive material attached to the ends of the tines so as to be vibrated thereby, the inner surface of the band constituting the outer cylindrical wall of the annular cavity and the band being arranged so as to permit coupling of the microwave energy through said aperture, and wherein said means responsive to the movement of the outer cylindrical wall comprises transducer means mounted in relation to the evacuated housing of the magnetron so as to monitor the movement of at least one tine of a tuning fork relative to it.

12. A magnetron as claimed in claim 11, wherein said transducer means comprises a separate velocity transducer provided to monitor the velocity of each tine relative to said housing.

13. A co-axial magnetron for generating a microwave signal, comprising: a cathode; an anode surrounding said cathode; tuning fork means for providing a substantially cylindrical wall surrounding said spaced apart from said anode so as to define an annular resonant cavity which surrounds said anode and which determines the resonant frequency of said microwave signal, said tuning fork means including means for vibrating said wall so as to cylindrically alter the radius thereof; and transducer means responsive to the movement of said wall for generating a signal representative of the instantaneous value of said radius.

14. A magnetron of claim 13, wherein said tuning fork means comprises at least one tuning fork having a pair of tines with ends which are free to vibrate and with inner surfaces which at least partially surround said anode and which are generally configured as segments of a cylinder.

15. The magnetron of claim 14, wherein said magnetron has an output port and wherein said tuning fork means comprises a single tuning fork, the tines thereof vibrating in anti-phase and being disposed so that the inner surfaces almost wholly surround said anode, the ends of said tines being spaced apart from each other to provide an aperture between said resonant cavity and said output port.

16. The magnetron of claim 14, wherein said inner surfaces of said tines form said substantially cylindrical wall.

17. The magnetron of claim 14, wherein said magnetron has an output port and wherein said tuning fork means comprises a plurality of tuning forks and means for electrically connecting said tuning forks and for causing all the tines thereof to vibrate in step while leaving an aperture between two of the tines, said aperture being disposed between said resonant cavity and said output port.

18. The magnetron of claim 17, wherein said means for electrically connecting comprises a thin flexible band of conductive material which is attached to each of said plurality of tuning forks and which forms said substantially cylindrical wall.

19. The magnetron of claim 14, wherein said transducer means monitors the movement of at least one tine.

20. The magnetron of claim 14, wherein said transducer means comprises means for monitoring the velocity of each tine.

21. The magnetron of claim 13, wherein said tuning fork means comprises a plurality of tuning forks, each tuning fork having a pair of tines which at least partially surround said anode and which have ends that are free to vibrate, and a thin flexible band of conductive material which is attached to the tines adjacent the ends thereof and which forms said substantially cylindrical wall.

* * * * *